US012591026B2

(12) United States Patent
Campiglio et al.

(10) Patent No.: US 12,591,026 B2
(45) Date of Patent: Mar. 31, 2026

(54) TUNNEL MAGNETORESISTANCE ELEMENT TO DETECT OUT-OF-PLANE CHANGES IN A MAGNETIC FIELD INTENSITY OF A MAGNETIC FIELD

(71) Applicants:Allegro MicroSystems, LLC, Manchester, NH (US); Commissariat à l'énergie atomique et aux énergies alternatives, Paris (FR)

(72) Inventors: Paolo Campiglio, Montreuil (FR); Doan Nguyen Ba, Nanterre (FR); Maxime Rioult, Massy (FR); Aurélie Solignac, Massy (FR); Jean-Michel Daga, Bourg-la-Reine (FR)

(73) Assignees: Allegro MicroSystems, LLC, Manchester, NH (US); Commissariat à l'énergie atomique et aux énergies alternatives, Paris (FR)

( * ) Notice: Subject to any disclaimer, the term of this patent is extended or adjusted under 35 U.S.C. 154(b) by 532 days.

(21) Appl. No.: 18/333,765

(22) Filed: Jun. 13, 2023

(65) Prior Publication Data

US 2024/0418805 A1    Dec. 19, 2024

(51) Int. Cl.
*G01R 33/09* (2006.01)
*H10N 50/01* (2023.01)
(Continued)

(52) U.S. Cl.
CPC ......... *G01R 33/093* (2013.01); *G01R 33/098* (2013.01); *H10N 50/01* (2023.02); *H10N 50/10* (2023.02); *H10N 50/85* (2023.02)

(58) Field of Classification Search
CPC .... G01R 33/093; G01R 33/098; H10N 50/01; H10N 50/85; H10N 50/10
(Continued)

(56) References Cited

U.S. PATENT DOCUMENTS 5,216,560 A    6/1993  Brug et al.
5,561,368 A    10/1996  Dovek et al.
(Continued)

FOREIGN PATENT DOCUMENTS

EP           2926349       4/2019
JP           2018-037613 A   3/2018
(Continued)

OTHER PUBLICATIONS

Taiwan Office Action (with English Translation) dated Oct. 29, 2024 for Taiwan Application No. 113112474; 17 Pages.
(Continued)

*Primary Examiner* — Jami Valentine Miller
(74) *Attorney, Agent, or Firm* — DALY, CROWLEY, MOFFORD & DURKEE, LLP

(57) ABSTRACT

In one aspect, a method includes manufacturing a tunneling magnetoresistance (TMR) element to sense out-of-plane changes in magnetic field intensity in a magnetic field. The manufacturing includes depositing a plurality of antiferromagnetic layers having magnetization directions alternating by layer between a first direction and a second direction opposite the first direction. A top layer of the plurality of antiferromagnetic layers has a magnetization direction in the first direction. The manufacturing also includes depositing a ferromagnetic layer directly on the top layer; depositing a first multilayer structure directly on the ferromagnetic layer; depositing a metal layer directly on the first multilayer structure; and depositing a second multilayer structure directly on the metal layer. The ferromagnetic layer, the first multilayer structure, and the second multilayer structure are each parallel to an x-y plane and the first direction is either in a z-direction or in a −z direction.

36 Claims, 9 Drawing Sheets

(51) Int. Cl.
     *H10N 50/10*       (2023.01)
     *H10N 50/85*       (2023.01)
(58) Field of Classification Search
     USPC .......................................................... 257/421
     See application file for complete search history.

(56)                  References Cited

U.S. PATENT DOCUMENTS

| | | | |
|---|---|---|---|
| 6,055,136 | A | 4/2000 | Gill et al. |
| 6,166,539 | A | 12/2000 | Dahlberg et al. |
| 6,490,140 | B1 | 12/2002 | Mao et al. |
| 6,501,678 | B1 | 12/2002 | Lenssen et al. |
| 7,064,937 | B2 | 6/2006 | Wan et al. |
| 7,259,545 | B2 | 8/2007 | Stauth et al. |
| 7,838,133 | B2 | 11/2010 | Zhang et al. |
| 8,269,491 | B2 | 9/2012 | Cummings et al. |
| 9,046,562 | B2 | 6/2015 | Cummings et al. |
| 9,123,877 | B2 * | 9/2015 | Lei ...................... G01R 33/0052 |
| 9,252,710 | B2 * | 2/2016 | Wang ................... H01F 10/3286 |
| 9,465,056 | B2 | 10/2016 | Han et al. |
| 9,529,060 | B2 * | 12/2016 | Fermon .................. H10N 50/01 |
| 9,812,637 | B2 | 11/2017 | Fermon et al. |
| 10,060,880 | B2 | 8/2018 | Chen et al. |
| 10,734,443 | B2 | 8/2020 | Lassalle-Balier et al. |
| 10,753,989 | B2 * | 8/2020 | Campiglio ........... G01R 33/093 |
| 12,512,137 | B2 * | 12/2025 | Jeong .................... G11C 11/161 |
| 2002/0044396 | A1 * | 4/2002 | Amano ................... B82Y 10/00 |
| | | | 365/158 |
| 2004/0145835 | A1 * | 7/2004 | Gill ....................... G11B 5/3954 |
| 2005/0068683 | A1 | 3/2005 | Gill |
| 2006/0218775 | A1 | 10/2006 | Carey et al. |
| 2007/0121249 | A1 | 5/2007 | Parker |
| 2008/0258721 | A1 | 10/2008 | Guo et al. |
| 2009/0027048 | A1 | 1/2009 | Sato et al. |
| 2009/0237075 | A1 | 9/2009 | Koss |
| 2010/0007344 | A1 | 1/2010 | Guo et al. |
| 2010/0142101 | A1 | 6/2010 | Sato et al. |
| 2010/0277971 | A1 | 11/2010 | Slaughter et al. |
| 2011/0062537 | A1 | 3/2011 | Oh et al. |
| 2011/0069413 | A1 | 3/2011 | Maat et al. |
| 2013/0140658 | A1 | 6/2013 | Yamane et al. |
| 2014/0145792 | A1 * | 5/2014 | Wang ..................... H10N 50/80 |
| | | | 428/828 |
| 2014/0175574 | A1 | 6/2014 | Watts et al. |
| 2014/0250244 | A1 | 9/2014 | Song et al. |
| 2015/0022196 | A1 | 1/2015 | Hebiguchi et al. |
| 2015/0177286 | A1 | 6/2015 | Fuji et al. |
| 2015/0192648 | A1 | 7/2015 | Campiglio et al. |
| 2015/0333254 | A1 | 11/2015 | Liu et al. |
| 2016/0218277 | A1 | 7/2016 | Yano et al. |
| 2016/0359103 | A1 | 12/2016 | Fermon et al. |
| 2017/0314969 | A1 | 11/2017 | Ausserlechner et al. |
| 2018/0062072 | A1 * | 3/2018 | Campiglio ........... G11B 5/3906 |
| 2019/0206934 | A1 | 7/2019 | Kim et al. |
| 2019/0219616 | A1 | 7/2019 | Cadugan et al. |
| 2019/0219643 | A1 | 7/2019 | Cadugan et al. |
| 2020/0033424 | A1 | 1/2020 | Campiglio et al. |
| 2021/0096195 | A1 | 4/2021 | Muehlenhoff et al. |
| 2021/0382122 | A1 | 12/2021 | Saito et al. |
| 2021/0389393 | A1 | 12/2021 | Lassalle-Balier et al. |
| 2022/0006006 | A1 * | 1/2022 | Komura ................. H10N 52/80 |

FOREIGN PATENT DOCUMENTS

| | | |
|---|---|---|
| TW | I 513993 B | 12/2015 |
| TW | I 6333321 B | 8/2018 |
| WO | WO 2018/012953 A1 | 1/2018 |

OTHER PUBLICATIONS

Response (with English Translation) to Taiwan Office Action dated Oct. 29, 2024 for Taiwan Application No. 113112474; Response Filed Jan. 22, 2025; 57 Pages.

Search Report and Written Opinion dated Jul. 4, 2024 PCT Application No. PCT/US2024/018802, 13 pages.

U.S. Preliminary Amendment filed on Oct. 19, 2018 for U.S. Appl. No. 16/113,321; 7 Pages.

U.S. Non-Final Office Action dated Feb. 7, 2020 for U.S. Appl. No. 16/113,321; 16 Pages.

Response to U.S. Non-Final Office Action dated Feb. 7, 2020 for U.S. Appl. No. 16/113,321; Response filed Apr. 10, 2020; 12 Pages.

U.S. Notice of Allowance dated May 14, 2020 for U.S. Appl. No. 16/113,321; 15 Pages.

U.S. Preliminary Amendment filed on Nov. 1, 2019 for U.S. Appl. No. 16/507,538; 12 Pages.

U.S. Second Preliminary Amendment filed on Nov. 4, 2019 for U.S. Appl. No. 16/507,538; 12 Pages.

U.S. Notice of Allowance dated May 4, 2020 for U.S. Appl. No. 16/507,538; 10 Pages.

Taiwan 1st Office Action (with English Translation) dated May 28, 2020 for Taiwan Application No. 108127885; 20 Pages.

Response (with Machine English Translation) to Taiwan Office Action dated May 28, 2020 for Taiwan Application No. 108127885; Response filed Aug. 18, 2020; 19 Pages.

Taiwan Allowance Decision (with English Translation) dated Oct. 29, 2020 for Taiwan Application No. 108127885; 3 Pages.

Extended European Search Report (EESR) dated Feb. 23, 2021 for European Application No. 20184390.1; 9 Pages.

Taiwan Office Action (with English Translation) dated Dec. 1, 2021 for Taiwan Application No. 110101393; 9 Pages.

Response (with Machine English Translation) to Taiwan Office Action dated Dec. 1, 2021 for Taiwan Application No. 110101393; Response filed Feb. 9, 2022; 38 Pages.

Taiwan Allowance Decision (with English Translation) dated May 2, 2022 for Taiwan Application No. 110101393; 3 Pages.

U.S. Notice of Allowance dated Aug. 22, 2019 for U.S. Appl. No. 15/869,620; 11 Pages.

Allegro MicroSystems, LLC, "High Sensitivity, 1 MHz GMR-Based Current Sensor IC in Space-Saving Low Resistance QFN Package;" ACS70331; Dec. 1, 2017; 22 Pages.

Guang et al., "Electrical Detection of Magnetic Skyrmions in a Magnetic Tunnel Junction;" Research Article from Advanced Electronic Materials; Sep. 2022; 8 Pages.

U.S. Appl. No. 18/333,680, filed Jun. 13, 2023, Jaiswal.

Taiwan Allowance Decision (with English Translation) dated Mar. 3, 2025 for Taiwan Application No. 113112474; 3 Pages.

U.S. Notice of Allowance dated May 16, 2025 for U.S. Appl. No. 18/333,680; 19 pages.

\* cited by examiner

TUNNEL MAGNETORESISTANCE ELEMENT TO DETECT OUT-OF-PLANE CHANGES IN A MAGNETIC FIELD INTENSITY OF A MAGNETIC FIELD

BACKGROUND

Magnetic-field sensors may include bridges (e.g., a Wheatstone bridge). The bridges typically include four or more magnetoresistance elements. Magnetoresistance elements in a bridge may include tunnel magnetoresistance (TMR) elements. Each TMR element may include a plurality of pillars.

SUMMARY

In one aspect, a method includes manufacturing a tunnel magnetoresistance (TMR) element to sense out-of-plane changes in magnetic field intensity in a magnetic field. The manufacturing includes depositing antiferromagnetic material on a seed layer. The antiferromagnetic material includes a plurality of antiferromagnetic layers having magnetization directions alternating by layer between a first direction and a second direction opposite the first direction. A top layer of the plurality of antiferromagnetic layers has a magnetization direction in the first direction. The manufacturing also includes depositing a ferromagnetic layer directly on the top layer of the plurality of antiferromagnetic layers, depositing a first multilayer structure directly on the ferromagnetic layer, depositing a metal layer directly on the first multilayer structure; and depositing a second multilayer structure directly on the metal layer. The ferromagnetic layer, the first multilayer structure, and the second multilayer structure are each parallel to an x-y plane. The first direction is either in a z-direction or in a −z direction. A magnetization direction of the second multilayer structure is in the second direction and is determined by and is opposite of the magnetization direction of the top layer of the plurality of antiferromagnetic layer, and the magnetization direction of the second multilayer structure is a reference direction of the TMR element.

In another aspect, a tunnel magnetoresistance (TMR) element includes antiferromagnetic material that includes a plurality of antiferromagnetic layers having magnetization directions alternating by layer between a first direction and a second direction opposite the first direction. A top layer of the plurality of antiferromagnetic layers has a magnetization direction in the first direction. The TMR element also includes a ferromagnetic layer in direct contact with the top layer of the plurality of antiferromagnetic layers; a first multilayer structure in direct contact with the ferromagnetic layer; a metal layer in direct contact with the first multilayer structure; and a second multilayer structure in direct contact with the metal layer, wherein the second multilayer structure is part of a reference layer. The ferromagnetic layer, the first multilayer structure and the second multilayer structure are each parallel to an x-y plane, and the first direction is either in a z-direction or in a −z direction. A magnetization direction of the second multilayer structure is in the second direction and is determined by and is opposite of the magnetization direction of the top layer of the plurality of antiferromagnetic layer, and wherein the magnetization direction of the second multilayer structure is a reference direction of the TMR element.

In a further aspect, a magnetic field sensor includes a bridge that includes a source, a first leg and a second leg. The first leg includes a first tunnel magnetoresistance (TMR)

element, and a second TMR element electrically in series with the first TMR element and electrically closer to the source than the first TMR element. The second leg includes a third TMR element; and a fourth TMR element electrically in series with the third TMR element and electrically closer to the source than the third TMR element. The first TMR element, the second TMR element, the third TMR element and the fourth TMR elements each includes antiferromagnetic material that includes a plurality of antiferromagnetic layers having magnetization directions alternating by layer between a first direction and a second direction opposite the first direction. A top layer of the plurality of antiferromagnetic layers having a magnetization direction in the first direction. The first TMR element, the second TMR element, the third TMR element and the fourth TMR elements each also includes a ferromagnetic layer in direct contact with the top layer of the plurality of antiferromagnetic layers; a first multilayer structure in direct contact with the ferromagnetic layer; a metal layer in direct contact with the first multilayer structure; and a second multilayer structure in direct contact with the metal layer, wherein the second multilayer structure is part of a reference layer. The ferromagnetic layer, the first multilayer structure and the second multilayer structure are each parallel to an x-y plane, and the first direction is either in a z-direction or in a −z direction. A magnetization direction of the second multilayer structure is in the second direction and is determined by and is opposite of the magnetization direction of the top layer of the plurality of antiferromagnetic layer. The magnetization direction of the second multilayer structure is a reference direction of the TMR element, the first TMR element and the fourth TMR element each have a reference direction in the z-direction; and the second TMR element and the third TMR element each have a reference direction in the −z-direction.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are techniques to fabricate a tunnel magnetoresistance (TMR) element that can detect out-of-plane changes in magnetic field intensity of a magnetic field. In particular, a magnetization direction of a top layer of antiferromagnetic material of the TMR element controls magnetization directions in a reference layer of the TMR element enabling out-of-plane detection of changing magnetic field intensity of a magnetic field. The reference layer of the TMR element includes a magnetization direction that is a reference direction of the TMR element. The reference direction is the direction in the TMR element where the TMR element is most sensitive to changes in the magnetic field intensity of magnetic field (i.e., a direction where changes in the magnetic field intensity produce the greatest changes in the resistance of the TMR element). Normally, magnetic field sensors with TMR elements are fabricated to detect changes in a magnetic field intensity in a plane (e.g., an x-y plane in FIG. 1) or in-plane detection where the reference direction is in the plane (e.g., the x-y plane in FIG. 1). However, fabrication of a TMR element in a magnetic field sensor to detect out-of-plane (e.g., detection in a z direction or in a –z direction, perpendicular to the x-y plane in FIG. 1) is not reliable, because traditional fabrication methods generally cannot fabricate a TMR element with a reference direction consistently in the z-direction or consistently in the –z-direction. As will be further described herein, a TMR element can be reliably fabricated with a reference direction in a z-direction or reliably fabricated with a reference direction in a –z direction to enable out-of-plane detection of changing magnetic field intensity.

Figure 1:
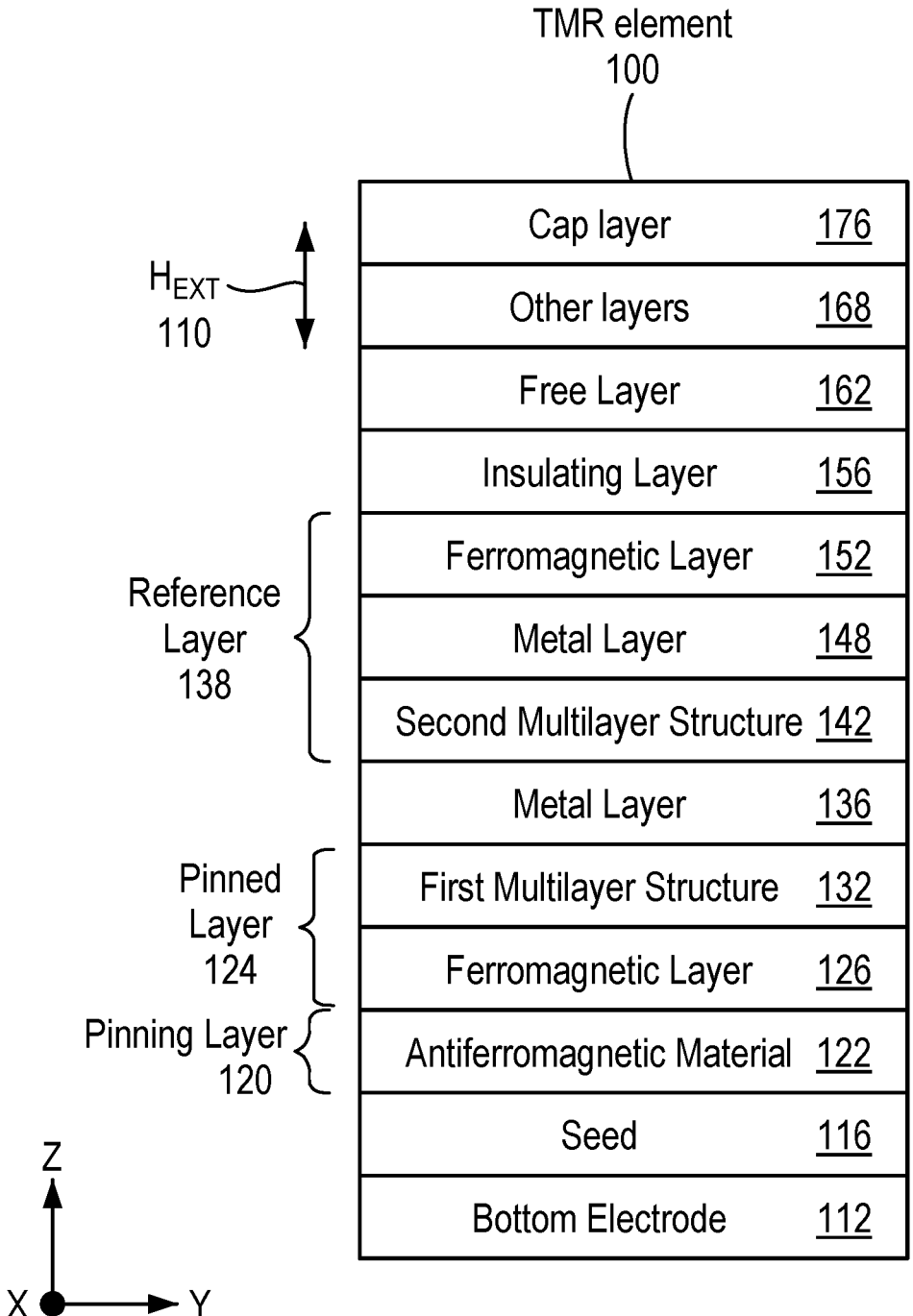
FIG. 1 is a diagram of an example of a tunnel magnetoresistance (TMR) element to detect out of plane changes in a magnetic field.

Referring to FIG. 1, a TMR element 100 is configured to detect changes in a magnetic field intensity of an external magnetic field $H_{EXT}$ in the z-direction or in the –z direction, which is out-of-plane detection; whereas in-plane detection detects changes in the magnetic field intensity of a magnetic field in the x-y-plane. TMR-based magnetic field sensors are generally limited to in-plane sensing of changes in a magnetic field intensity of magnetic field.

One of the main challenges of out-of-plane sensing of changes in a detected magnetic field intensity is obtaining a crossed anisotropy configuration capable of providing a variable output depending on the magnetic intensity. In particular, an output of a TMR element is proportional to the angle between a magnetization direction of the reference layer and a magnetization direction of the free layer. For TMR elements used in memory devices (e.g., magnetoresistive random-access memory (MRAM) and hard drive disks (HDD), the TMR element can detect out of plane magnetic fields; however, the TMR element used in memory devices is essentially a switch, which means that a magnetization direction of a free layer abruptly changes from parallel to antiparallel with respect to the magnetization direction of the reference layer so that there is no measurable point in between the parallel and antiparallel directions to measure changing resistance due to a changing magnetic field intensity. Thus, abrupt changes in the magnetization direction of the free layer are impractical for use in magnetic field sensors.

As described herein, a magnetic field sensor that has a magnetization direction of the free layer that has measurable changes in between parallel and antiparallel with changing magnetic field intensity is desired. Thus, continuously changing the free layer orientation so that for a certain magnetic field amplitude a measurable angle between the magnetization direction of the free layer and the magnetization direction of the reference layer is established enables a resistance value of the TMR element to be measured. A crossed anisotropy configuration enables a starting point where the magnetization direction of the free layer is naturally perpendicular to the magnetization direction of the reference layer. Thus, the detected magnetic field rotates the magnetization direction of the free layer from being perpendicular to the magnetization direction of the reference layer to being either parallel or antiparallel to magnetization direction of the reference layer (depending on the direction of the magnetic field applied) thereby enabling several points of resistance measurement to be taken in between.

The TMR element 100 includes a bottom electrode 112; a seed layer on the bottom electrode 112; a pinning layer 120 on the seed layer 116; and a pinned layer 124 on pinning layer 120. The pinning layer 120 includes an antiferromagnetic material 122. The pinned layer 124 includes a ferromagnetic layer 126 on the antiferromagnetic material 122, and a first multilayer structure 132 on the ferromagnetic layer 126. In one example, the ferromagnetic layer 126 may include cobalt alone or include cobalt such as for example, cobalt iron or cobalt iron boron.

The TMR element 100 also includes a metal layer 136 on the pinned layer 124; and a reference layer 138 on the metal layer 136. Sometimes the metal layer 136 is called a spacer layer. In one example, the metal layer 136 is ruthenium. The reference layer 138 includes a second multilayer structure 142 on the metal layer 136; a metal layer 148 on the second multilayer structure 142; and a ferromagnetic layer 152. In one example, the ferromagnetic layer 152 may include cobalt alone or include cobalt such as for example, cobalt iron or cobalt iron boron.

In one example, the metal layer 148 is tantalum. In one example, the metal layer 148 is called a space layer that enables decoupling of the crystal structure of the ferromagnetic layer 152 from other layers below. In other examples, the metal layer 148 is not included at all in the TMR element 100.

The TMR element 100 further includes an insulating layer 156 on the reference layer 138; a free layer 162 on the insulating layer 156; other layers 168 on the free layer 162; and a cap layer 176 on the other layers 168. In one example, the insulating layer 156 includes magnesium oxide. In one example, the free layer 162 may include cobalt iron boron. In one example, a magnetization direction of the free layer 162 lies entirely in the x-y plane.

In one particular example, the ferromagnetic layer 152 is also cobalt iron boron. Cobalt iron boron is used in the ferromagnetic layer 152 because cobalt iron boron is amorphous and, during annealing, the cobalt iron boron follows the crystallization structure of magnesium oxide (when used as the insulating layer 156) producing a consistent crystal structure between the insulating layer 156 and the ferromagnetic layer 152 having a higher magnetic field to resistance (MR) ratio In one example, the other layers 162 include a striped domain structure that includes a plurality of sublayers. In one example, each sublayer may include a heavy metal layer (e.g., platinum) and a metal ferromagnetic layer (e.g., cobalt) with or without a buffer layer (e.g., a tantalum layer). In another example, each sublayer may include a ferromagnetic layer (e.g., cobalt) and an oxide layer (e.g., magnesium oxide) with or without a buffer layer (e.g., a tantalum layer). In a further example, each sublayer may include a heavy metal layer (e.g., platinum), a ferromagnetic layer (e.g., cobalt) and an oxide layer (e.g., magnesium oxide) with or without a buffer layer (e.g., a tantalum layer). The movement of domain walls inside the striped domain structure allows detection of out-of-plane changes in the magnetic field intensity and almost no detection of changes in the in-plane magnetic field intensity. In another example the other layers 168 may include a bias layer.

Figure 2A:
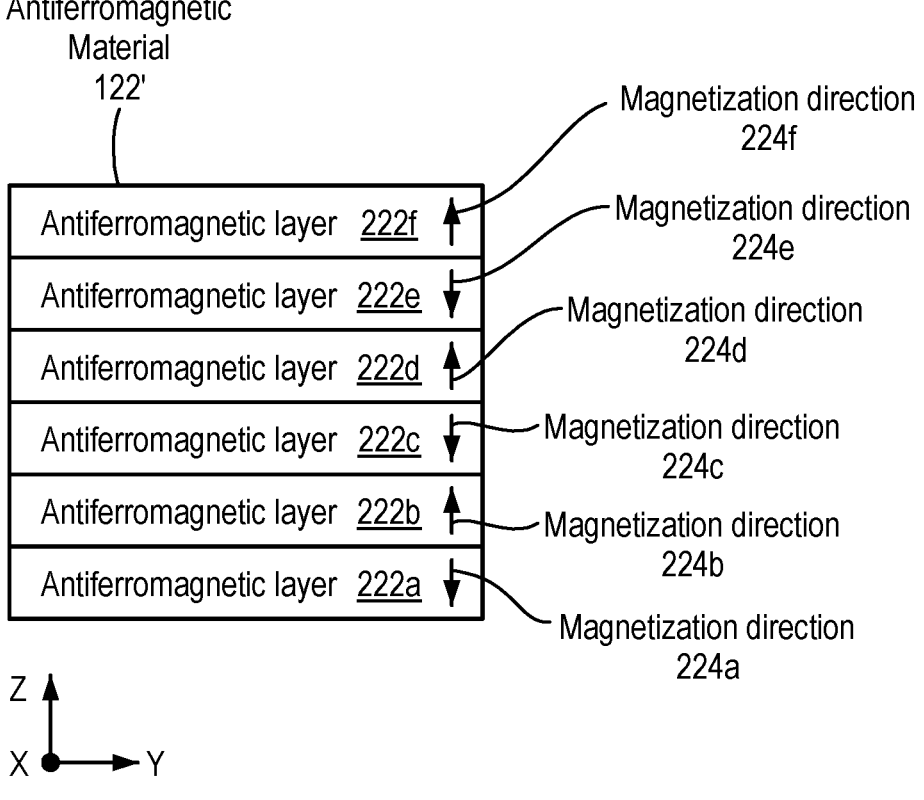
FIG. 2A is a diagram of an example of an antiferromagnetic material.

Referring to FIG. 2A, an example of the antiferromagnetic material 122 is an antiferromagnetic material 122'. The antiferromagnetic material 122' includes antiferromagnetic layers (e.g., an antiferromagnetic layer 222a, an antiferromagnetic layer 222b, an antiferromagnetic layer 222c, an antiferromagnetic layer 222d, an antiferromagnetic layer 222e, and an antiferromagnetic layer 222f). The antiferromagnetic layer 222f is considered herein to be the top layer.

In one example, the antiferromagnetic layers 222a-222f are the same material. In one example, the antiferromagnetic layers 222a-222f may be platinum manganese, iridium manganese or iron manganese.

The antiferromagnetic layers 222a-222f include magnetization directions that are opposite in direction by antiferromagnetic layer. For example, the antiferromagnetic layer 222a has a magnetization direction 224a in the −z direction, the antiferromagnetic layer 222b has a magnetization direction 224b in the z direction, the antiferromagnetic layer 222c has a magnetization direction 224c in the −z direction, the antiferromagnetic layer 222d has a magnetization direction 224d in the z direction, the antiferromagnetic layer 222e has a magnetization direction 224e in the −z direction, and the antiferromagnetic layer 222f has a magnetization direction 224f in the z direction. As will be further described herein, the magnetization direction 224f controls magnetization directions of upper layers of the TMR element 100.

In one example, the magnetization direction 224f is formed by heating the antiferromagnetic layer 222f using a laser focused solely on the antiferromagnetic layer 222f and exposing the antiferromagnetic layer 222f to an external magnetic field. In another example, the magnetization direction 224f is formed by applying a current pulse through the TMR element 100 and exposing the antiferromagnetic layer 222f to an external magnetic field.

Figure 2B:
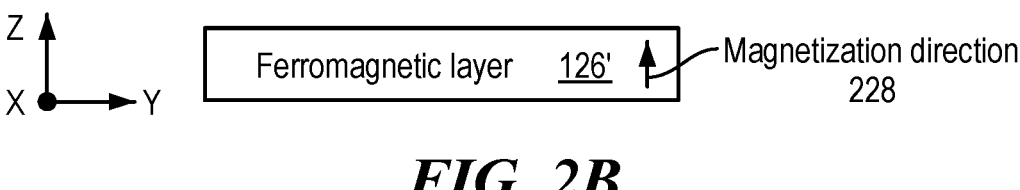
FIG. 2B is a diagram of an example of a ferromagnetic material.

Referring to FIG. 2B, an example of the ferromagnetic layer 126 is a ferromagnetic layer 126'. The pinned layer 120 (FIG. 1), specifically the magnetization direction 224f, pins a magnetization direction 228 of the ferromagnetic layer 126'. Thus, the magnetization direction 228 is determined by and is the same as the magnetization direction 224f.

Figure 2C:
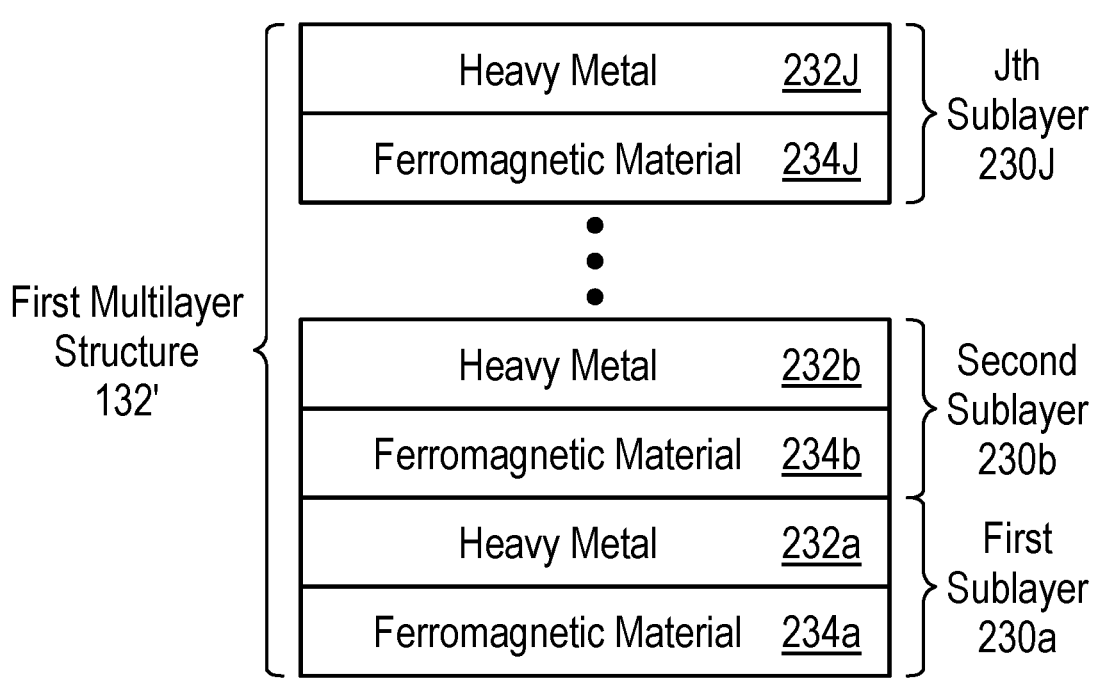
FIG. 2C is a diagram of an example of a first multilayer structure.

Referring to FIG. 2C, an example of the first multilayer structure 132 is a first multilayer structure 132'. The first multilayer structure 132' includes a first sublayer 230a, a second sublayer 230b, . . . , and a Jth sublayer 230J, where J>2. In other examples, the first multilayer structure 132' may include one or two sublayers.

The first sublayer 230a includes a heavy metal 232a on top of a ferromagnetic material 234a. The second sublayer 230b includes a heavy metal 232b on top of a ferromagnetic material 234b. The Jth sublayer 230J includes a heavy metal 232J on top of a ferromagnetic material 234J.

In one example, the heavy metal 232a-232J may be platinum. In one example, the ferromagnetic material 234a-234J may be cobalt or include cobalt such as for example, cobalt iron or cobalt iron boron.

Figure 2D:
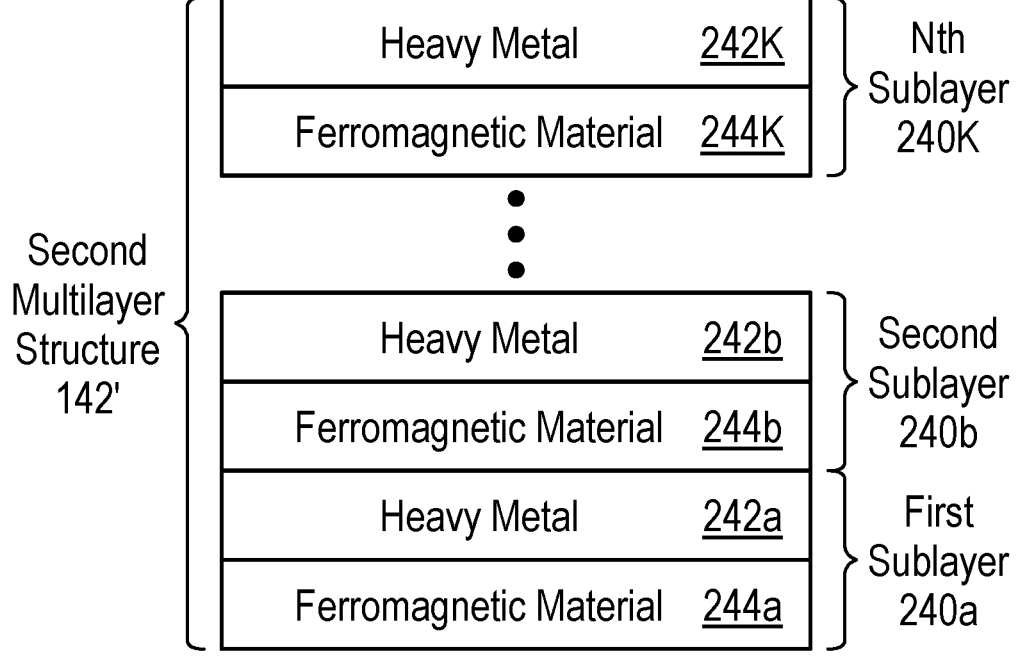
FIG. 2D is a diagram of an example of a second multilayer structure.

Referring to FIG. 2D, an example of the second multilayer structure 142 is a second multilayer structure 142'. The second multilayer structure 142' includes a first sublayer 240a, a second sublayer 240b, . . . , and a Kth sublayer 240K, where K>2. In other examples, the second multilayer structure 142' may include one or two sublayers. In one example, J does not equal K. In another example, J equals K.

The first sublayer 240a includes a heavy metal 242a on top of a ferromagnetic material 244a. The second sublayer 240b includes a heavy metal 242b on top of a ferromagnetic material 244b. The Kth sublayer 240K includes a heavy metal 242K on top of a ferromagnetic material 244K.

In one example, the heavy metal 242a-242K may be platinum. In one example, the ferromagnetic material 244a-244K may be cobalt or include cobalt such as, for example, cobalt iron or cobalt iron boron.

Figure 2E:
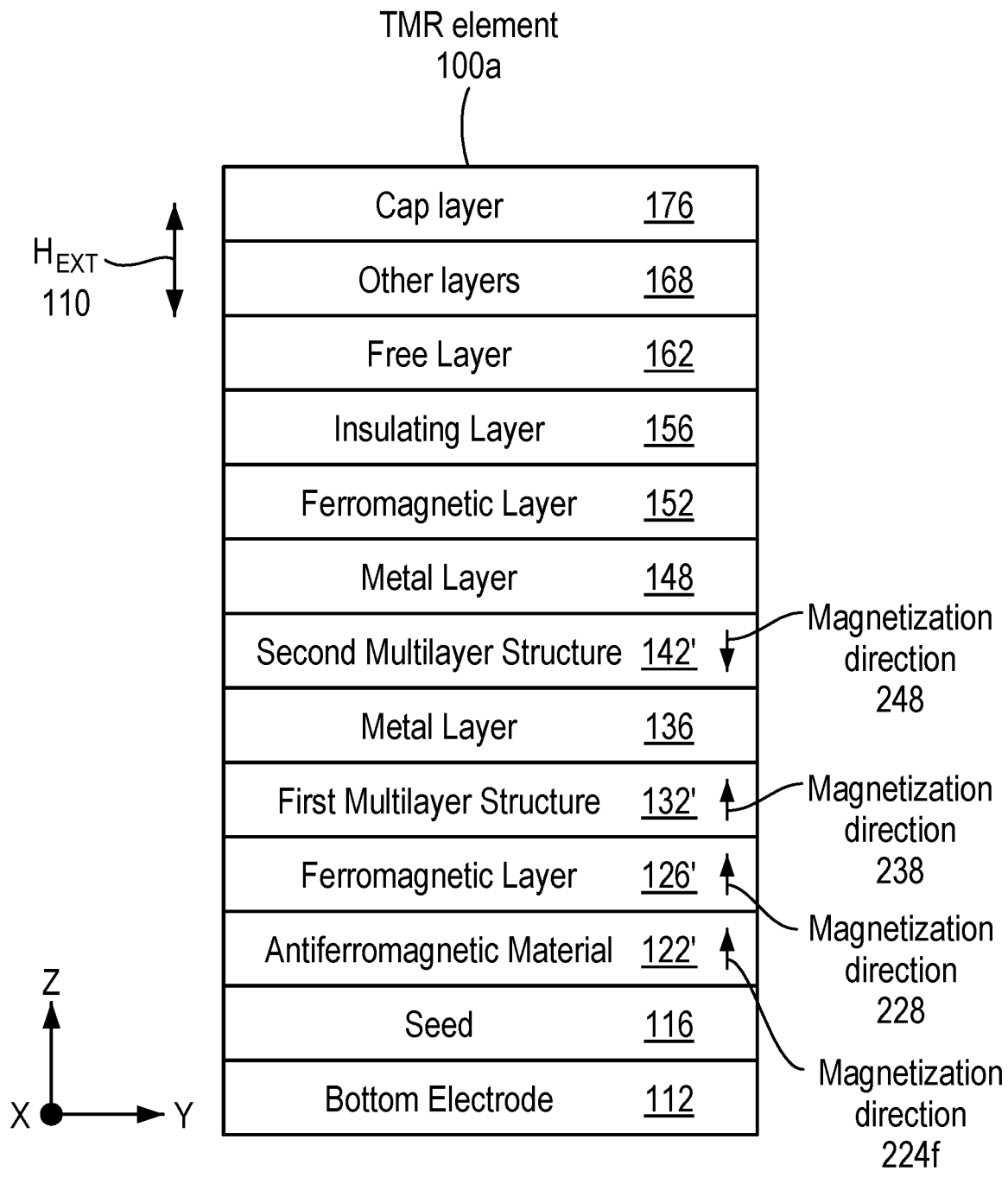
FIG. 2E is a diagram of an example of the TMR element in FIG. 1.

Referring to FIG. 2E, the pinned layer 120 (FIG. 1), specifically the magnetization direction 224f (FIG. 2A), pins a magnetization direction 238 of the first multilayer structure 132'. Thus, the magnetization direction 238 is determined by and is the same as the magnetization direction 224f.

A magnetization direction 248 of the second multilayer structure 142' is the opposite of the magnetization direction 238 of the first multilayer structure 132'. The thickness of the metal layer 136 (FIG. 1) enables the magnetization direction 248 to be the opposite of the magnetization direction 238 through a RKKY (Ruderman-Kittel-Kasuya-Yosida) coupling mechanism. Thus, the magnetization direction 248 is determined by and is the opposite of the magnetization direction 224f. The magnetization direction 248 is a reference direction of a TMR element 100a and is in the −z direction.

Figure 3A:
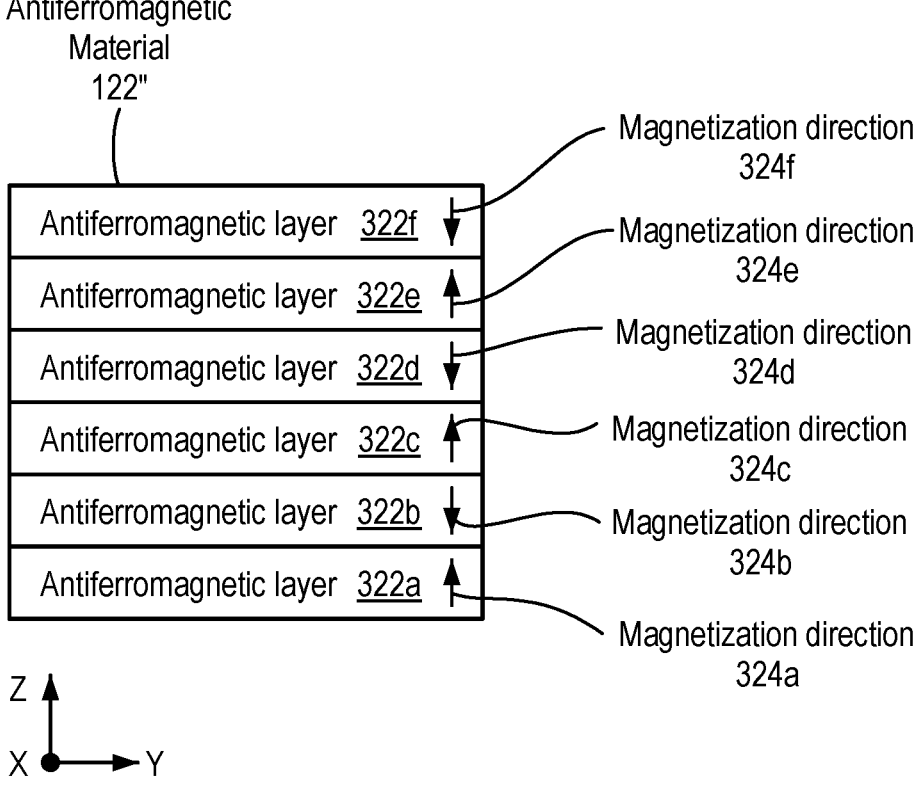
FIG. 3A is a diagram of another example of an antiferromagnetic material.

Referring to FIG. 3A, another example of the antiferromagnetic material 122 is an antiferromagnetic material 122". The antiferromagnetic material 122" includes antiferromagnetic layers (e.g., an antiferromagnetic layer 322a, an antiferromagnetic layer 322b, an antiferromagnetic layer 322c, an antiferromagnetic layer 322d, an antiferromagnetic layer 322e, and an antiferromagnetic layer 322f). The antiferromagnetic layer 322f is considered herein to be the top layer.

In one example, the antiferromagnetic layers 322a-322f are the same material. In one example, the antiferromagnetic layers 322a-322f may be platinum manganese, iridium manganese or iron manganese.

The antiferromagnetic layers 322a-322f include magnetization directions that are opposite in direction by antiferromagnetic layer. For example, the antiferromagnetic layer 322a has a magnetization direction 324a in the z direction, the antiferromagnetic layer 322b has a magnetization direction 324b in the −z direction, the antiferromagnetic layer 322c has a magnetization direction 324c in the z direction, the antiferromagnetic layer 322d has a magnetization direction 324d in the −z direction, the antiferromagnetic layer 322e has a magnetization direction 324e in the z direction, and the antiferromagnetic layer 322f has a magnetization direction 324f in the −z direction. As will be further described herein, the magnetization direction 324f controls magnetization directions of upper layers of the TMR element 100.

In one example, the magnetization direction 324f is formed by heating the antiferromagnetic layer 322f using a laser focused solely on the antiferromagnetic layer 322f and exposing the antiferromagnetic layer 322f to an external magnetic field. In another example, the magnetization direction 324*f* is formed by applying a current pulse through the TMR element 100 and exposing the antiferromagnetic layer 322*f* to an external magnetic field.

Figure 3B:
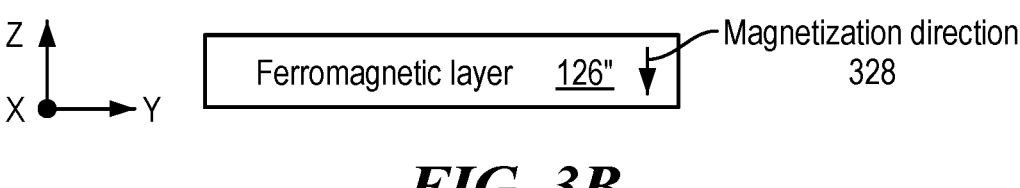
FIG. 3B is a diagram of another example of a ferromagnetic material.

Referring to FIG. 3B, another example of the ferromagnetic layer 126 is a ferromagnetic layer 126". The pinned layer 120 (FIG. 1), specifically, the magnetization direction 324*f* (FIG. 3A) pins a magnetization direction 328. Thus, the magnetization direction 328 is determined by and is the same as the magnetization direction 324*f* (FIG. 3A).

Figure 3C:
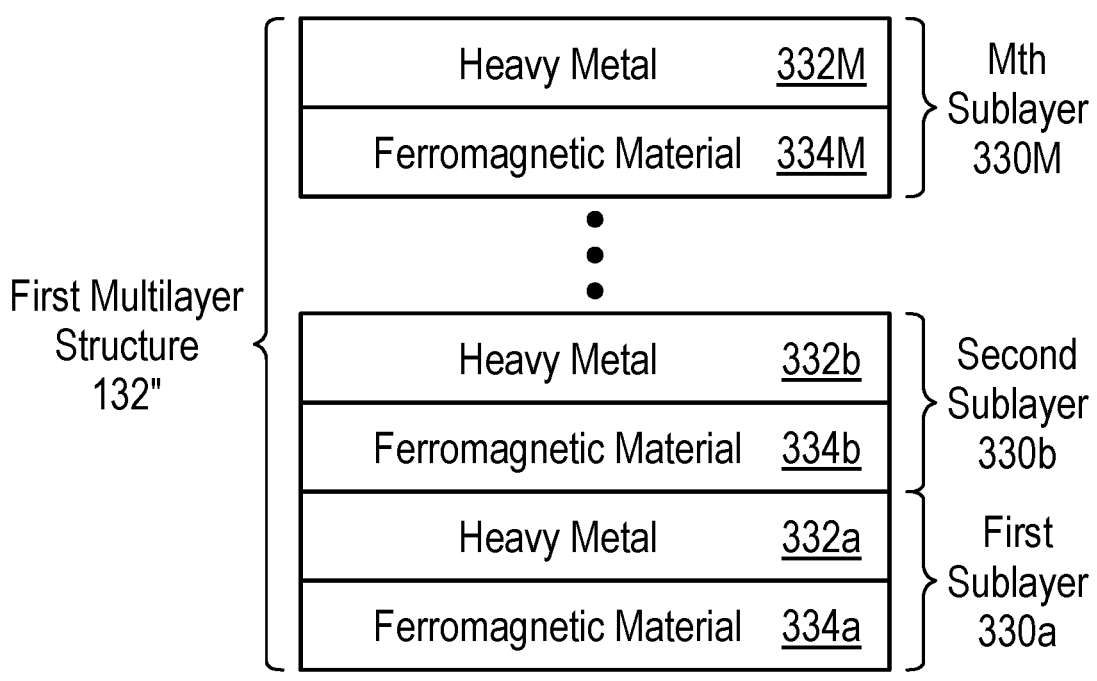
FIG. 3C is a diagram of another example of a first multilayer structure.

Referring to FIG. 3C, another example of the first multilayer structure 132 is a first multilayer structure 132". The first multilayer structure 132" includes a first sublayer 330*a*, a second sublayer 330*b*, . . . , and a Mth sublayer 330M, where M>2. In other examples, the first multilayer structure 132" may include one or two sublayers.

The first sublayer 330*a* includes a heavy metal 332*a* on top of a ferromagnetic material 334*a*. The second sublayer 330*b* includes a heavy metal 332*b* on top of a ferromagnetic material 334*b*. The Mth sublayer 330M includes a heavy metal 332M on top of a ferromagnetic material 334M.

In one example, the heavy metal 332*a*-332M may be platinum. In one example, the ferromagnetic material 334*a*-334M may be cobalt or include cobalt such as, for example, cobalt iron or cobalt iron boron.

Figure 3D:
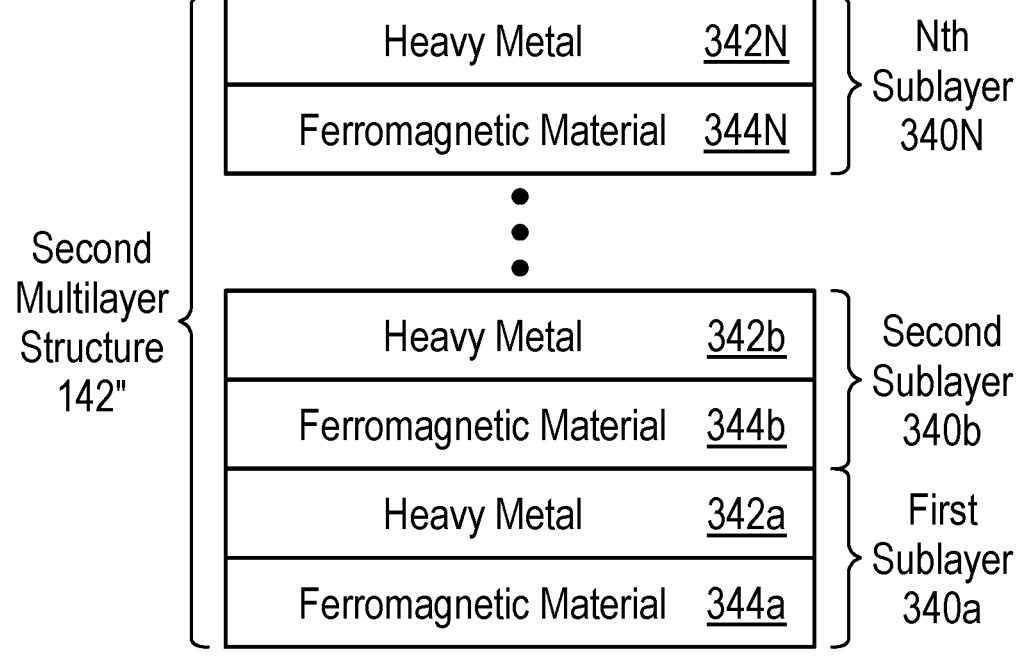
FIG. 3D is a diagram of another example of a second multilayer structure.

Referring to FIG. 3D, another example of the second multilayer structure 142 is a second multilayer structure 142". The second multilayer structure 142" includes a first sublayer 340*a*, a second sublayer 340*b*, . . . , and a Nth sublayer 340N, where N>2. In other examples, the second multilayer structure 142" may include one or two sublayers. In one example, M does not equal N. In another example, M equals N.

The first sublayer 340*a* includes a heavy metal 342*a* on top of a ferromagnetic material 344*a*. The second sublayer 340*b* includes a heavy metal 342*b* on top of a ferromagnetic material 344*b*. The Nth sublayer 340N includes a heavy metal 342N on top of a ferromagnetic material 344N.

In one example, the heavy metal 342*a*-342N may be platinum. In one example, the ferromagnetic material 344*a*-344N may be cobalt or include cobalt such as, for example, cobalt iron or cobalt iron boron.

Figure 3E:
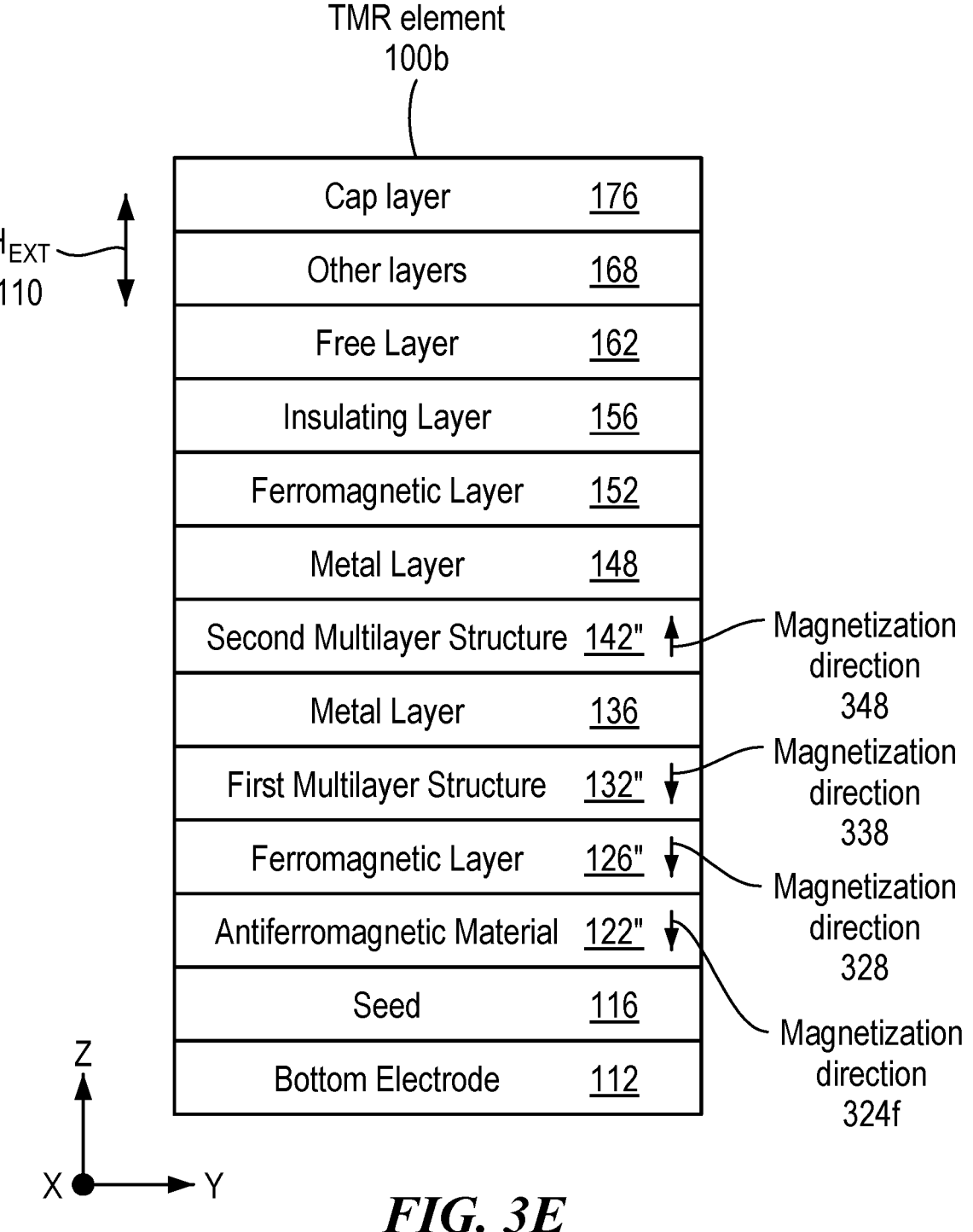
FIG. 3E is a diagram of another example of the TMR element in FIG. 1.

Referring to FIG. 3E, the pinned layer 120 (FIG. 1), specifically the magnetization direction 324*f* (FIG. 3A), pins a magnetization direction 338 of the first multilayer structure 132". Thus, the magnetization direction 338 is determined by and is the same as the magnetization direction 324*f*.

A magnetization direction 348 of the second multilayer structure 142" is the opposite of the magnetization direction 338 of the first multilayer structure 132". The thickness of the metal layer 136 (FIG. 1) enables the magnetization direction 348 to be the opposite of the magnetization direction 338 through a RKKY coupling mechanism. Thus, the magnetization direction 348 is determined by and is the opposite of the magnetization direction 324*f*. The magnetization direction 348 is a reference direction of a TMR element 100*b* and is in the z direction.

Figure 4A:
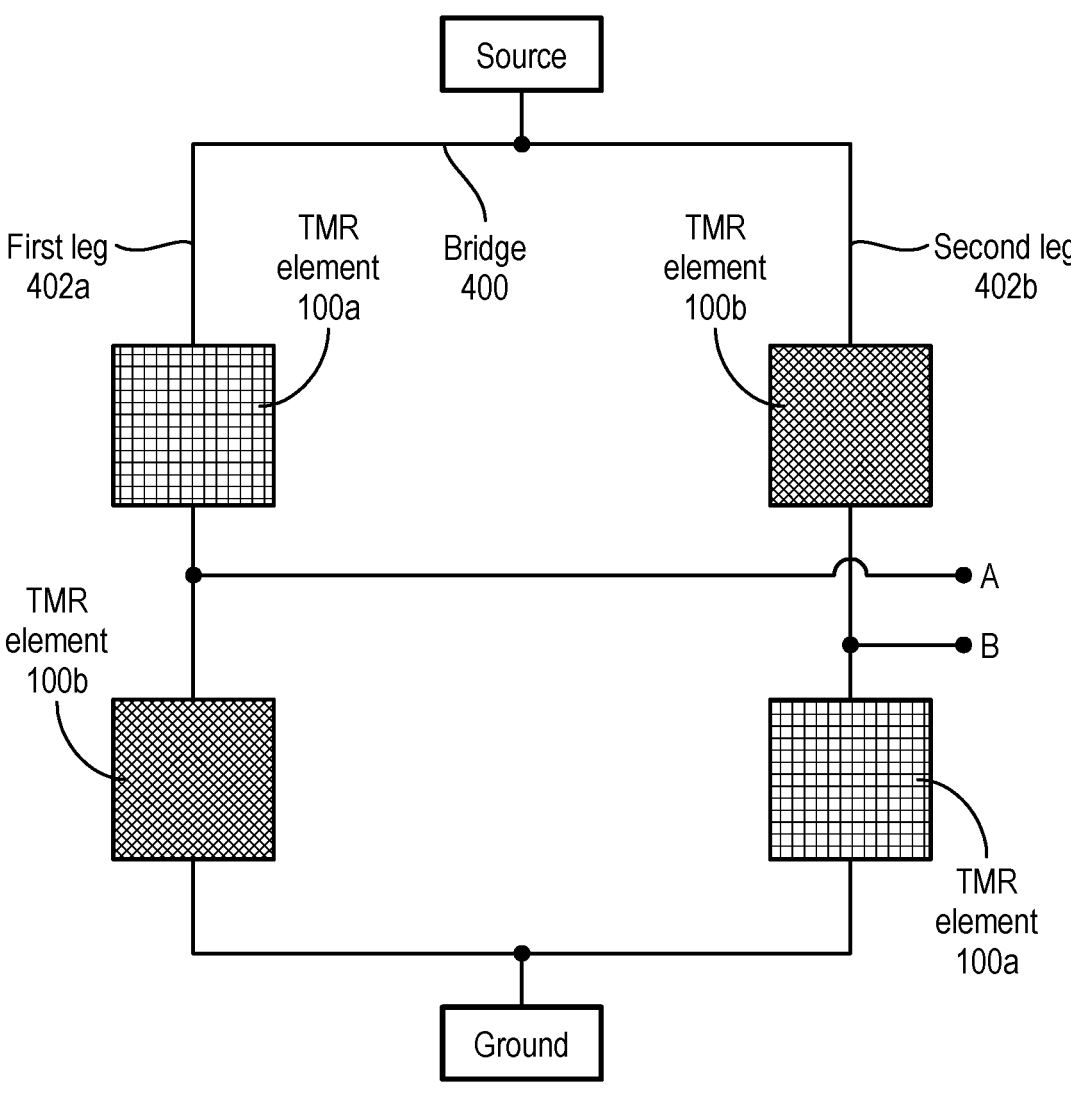
FIG. 4A is a diagram of an example of a bridge using the TMR elements in FIGS. 2E and 3E.

Referring to FIG. 4A, a bridge 400 (e.g., a Wheatstone bridge) includes a first leg 402*a* that includes the TMR element 100*a* (FIG. 2E) in electrical series the TMR element 100*b* (FIG. 3E). In the first leg 402*a*, the TMR element 100*a* is closest to a source and the TMR element 100*b* is closest to a ground. The bridge 400 also includes a second leg 402*b* that includes the TMR element 100*a* (FIG. 2E) in electrical series with the TMR element 100*b* (FIG. 3E). In the second leg 402*b*, the TMR element 100*b* is closest to the source and the TMR element 100*a* is closest to the ground. The bridge 400 produces a differential output at nodes A, B forming an out-of-plane magnetometer or z-axis magnetometer.

Figure 4B:
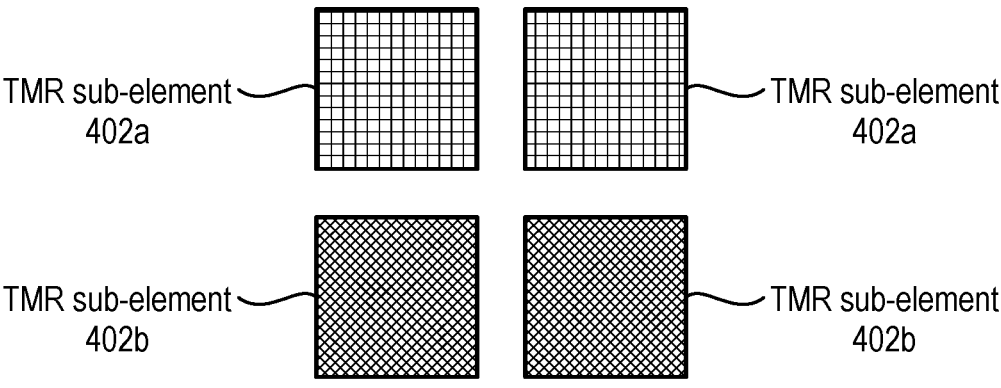
FIG. 4B is a diagram of TMR sub-elements of the TMR elements in FIGS. 2E and 3E.
Figure 4C:
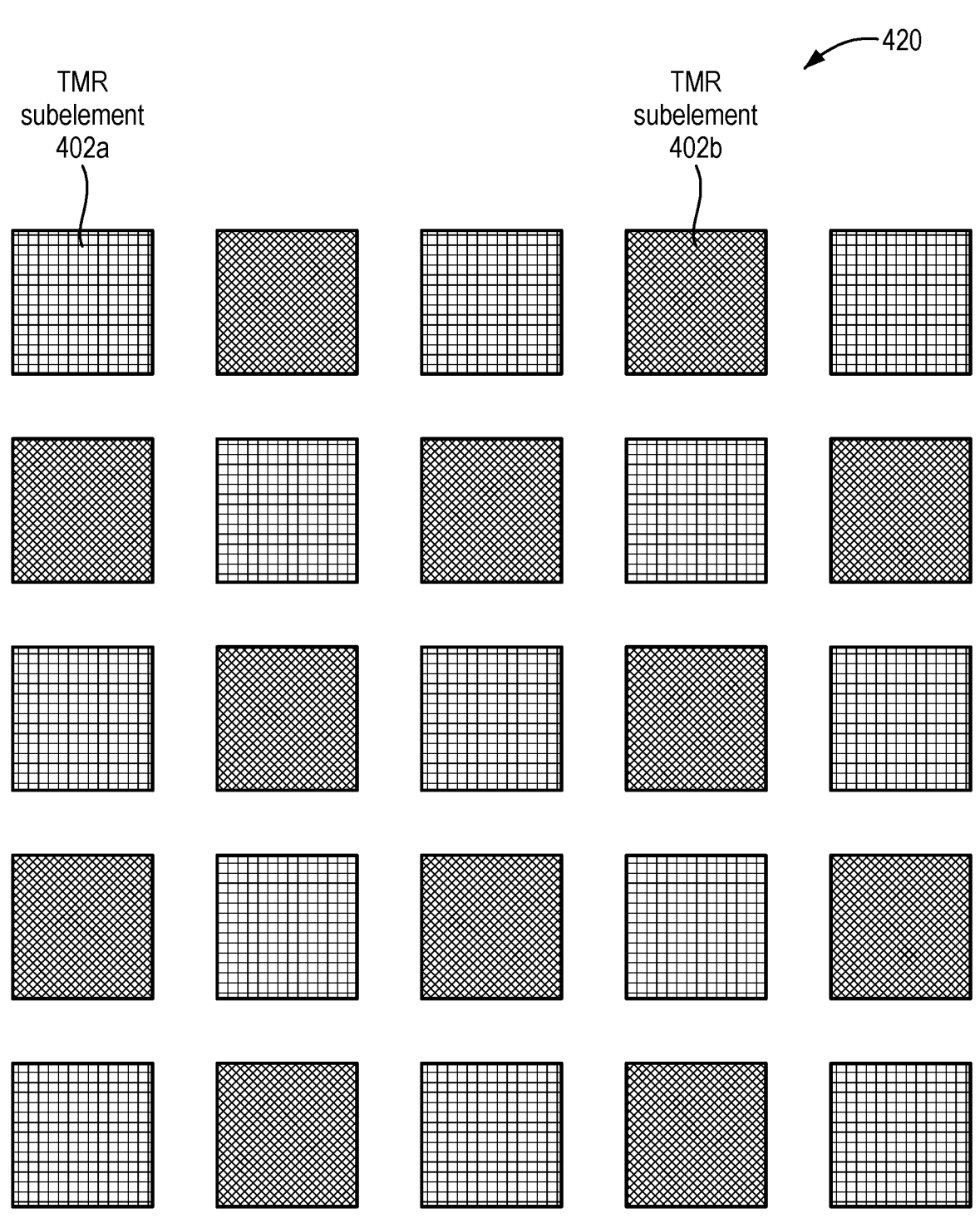
FIG. 4C is a diagram of an example of a layout of TMR sub-elements.

Referring to FIGS. 4B and 4C, the TMR element 102*a* (FIG. 2E) may be divided into sub-elements such as TMR sub-elements 402*a*, and the TMR element 102*b* (FIG. 3E) may be divided into sub-elements such as TMR sub-elements 402*b*. The TMR sub-elements 402*a* and the TMR sub-elements 402*b* may be interleaved in a checkerboard layout such as, for example, layout 420.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A method comprising:
manufacturing a tunnel magnetoresistance (TMR) element to sense out-of-plane changes in magnetic field intensity in a magnetic field, the manufacturing comprising:
depositing antiferromagnetic material on a seed layer, the antiferromagnetic material comprising a plurality of antiferromagnetic layers having magnetization directions alternating by layer between a first direction and a second direction opposite the first direction, a top layer of the plurality of antiferromagnetic layers having a magnetization direction in the first direction;
depositing a ferromagnetic layer directly on the top layer of the plurality of antiferromagnetic layers;
depositing a first multilayer structure directly on the ferromagnetic layer;
depositing a metal layer directly on the first multilayer structure; and
depositing a second multilayer structure directly on the metal layer,
wherein the ferromagnetic layer, the first multilayer structure, and the second multilayer structure are each parallel to an x-y plane,
wherein the first direction is either in a z-direction or in a −z direction,
wherein a magnetization direction of the second multilayer structure is in the second direction and is determined by and is opposite of the magnetization direction of the top layer of the plurality of antiferromagnetic layer, and
wherein the magnetization direction of the second multilayer structure is a reference direction of the TMR element.

2. The method of claim 1, wherein the ferromagnetic layer is a first magnetic layer, and further comprising:
depositing a second ferromagnetic layer on the second multilayer structure;
depositing an insulator layer directly on the second ferromagnetic layer; and
depositing a free layer on the insulator layer.

3. The method of claim 2, wherein a magnetization direction of the free layer lies within the x-y plane.

4. The method of claim 2, further comprising depositing a striped domain structure on the free layer.

5. The method of claim 4, wherein depositing the striped domain structure on the free layer comprises depositing the striped domain structure comprising one or more sublayers.

6. The method of claim 5, wherein each sublayer comprises at least one heavy metal and at least one ferromagnetic material.

7. The method of claim 5, wherein each sublayer comprises at least one oxide layer and at least one ferromagnetic layer.

8. The method of claim 7, wherein each sublayer further comprises at least one heavy metal.

9. The method of claim 5, wherein each sublayer further comprises a buffer layer.

10. The method of claim 2, wherein the metal layer is a first metal layer, and further comprising depositing a second metal layer on the second multilayer structure before depositing the second ferromagnetic layer.

11. The method of claim 1, wherein a magnetization direction of the first multilayer structure is in the first direction and is determined by the magnetization direction of the top layer of the plurality of antiferromagnetic layers.

12. The method of claim 11, wherein the magnetization direction of the top layer of the plurality of antiferromagnetic layers is formed using a laser or with a current pulse through the TMR element.

13. The method of claim 1, wherein depositing the first multilayer structure comprises depositing sublayers, and wherein each sublayer comprises a first heavy metal layer and a first ferromagnetic material layer.

14. The method of claim 13, wherein depositing the second multilayer structure comprises depositing sublayers, and wherein each sublayer comprises a second heavy metal layer and a second ferromagnetic material layer.

15. The method of claim 14, wherein a total number of sublayers of the first multilayer structure is not equal to a total number of sublayers of the second multilayer structure.

16. The method of claim 14, wherein a total number of sublayers of the first multilayer structure is equal to a total number of sublayers of the second multilayer structure.

17. The method of claim 14, wherein the first heavy metal layer and/or the second heavy metal layer is a platinum layer, and the first ferromagnetic material layer and/or the second ferromagnetic material layer comprises a cobalt element.

18. The method of claim 1, where depositing the antiferromagnetic material comprises depositing iridium manganese, platinum manganese or iron manganese.

19. A tunnel magnetoresistance (TMR) element comprising:

antiferromagnetic material comprising a plurality of antiferromagnetic layers having magnetization directions alternating by layer between a first direction and a second direction opposite the first direction, a top layer of the plurality of antiferromagnetic layers having a magnetization direction in the first direction;

a ferromagnetic layer in direct contact with the top layer of the plurality of antiferromagnetic layers;

a first multilayer structure in direct contact with the ferromagnetic layer;

a metal layer in direct contact with the first multilayer structure; and a second multilayer structure in direct contact with the metal layer, wherein the second multilayer structure is part of a reference layer, wherein the ferromagnetic layer, the first multilayer structure and the second multilayer structure are each parallel to an x-y plane, wherein the first direction is either in a z-direction or in a −z direction, wherein a magnetization direction of the second multilayer structure is in the second direction and is determined by and is opposite of the magnetization direction of the top layer of the plurality of antiferromagnetic layer, and wherein the magnetization direction of the second multilayer structure is a reference direction of the TMR element.

20. The TMR element of claim 19, wherein the ferromagnetic layer is a first magnetic layer, and further comprising:

a second ferromagnetic layer on the second multilayer structure; and an insulator layer in direct contact with the second ferromagnetic layer;

a free layer on the insulator layer.

21. The TMR element of claim 20, wherein a magnetization direction of the free layer lies within the x-y plane.

22. The TMR element of claim 20, further comprising a striped domain structure on the free layer.

23. The TMR element of claim 22, wherein the striped domain structure comprises one or more sublayers.

24. The TMR element of claim 23, wherein each sublayer comprises at least one heavy metal and at least one ferromagnetic material.

25. The TMR element of claim 23, wherein each sublayer comprises at least one oxide layer and at least one ferromagnetic layer.

26. The TMR element of claim 25, wherein each sublayer further comprises at least one heavy metal.

27. The TMR element of claim 23, wherein each sublayer comprises a buffer layer.

28. The TMR element of claim 20, wherein the metal layer is a first metal layer, and further comprising a second metal layer between the second ferromagnetic layer and the second multilayer structure.

29. The TMR element of claim 19, wherein a magnetization direction of the first multilayer structure is in the first direction and is determined by the magnetization direction of the top layer of the plurality of antiferromagnetic layers.

30. The TMR element of claim 19, wherein the first multilayer structure comprises sublayers, wherein each sublayer comprises a first heavy metal layer and a first ferromagnetic material layer.

31. The TMR element of claim 30, wherein the second multilayer structure comprises sublayers, wherein each sublayer comprises a second heavy metal layer and a second ferromagnetic material layer.

32. The TMR element of claim 31, wherein the first heavy metal layer and/or the second heavy metal layer is a platinum layer and the first ferromagnetic material layer and/or the second ferromagnetic material layer comprises a cobalt element.

33. The TMR element of claim 31, wherein a total number of sublayers of the first multilayer structure is not equal to a total number of sublayers of the second multilayer structure.

34. The TMR element of claim 31, wherein a total number of sublayers of the first multilayer structure is equal to a total number of sublayers of the second multilayer structure.

35. The TMR element of claim 19, where the antiferromagnetic material comprises iridium manganese, platinum manganese or iron manganese.

36. A magnetic field sensor comprising:

a bridge comprising:

a source;

a first leg comprising:

a first tunnel magnetoresistance (TMR) element; and a second TMR element electrically in series with the first TMR element and electrically closer to the source than the first TMR element; and a second leg comprising:

a third TMR element; and a fourth TMR element electrically in series with the third TMR element and electrically closer to the source than the third TMR element, wherein the first TMR element, the second TMR element, the third TMR element and the fourth TMR elements each comprises:

antiferromagnetic material comprising a plurality of antiferromagnetic layers having magnetization directions alternating by layer between a first direction and a second direction opposite the first direction, a top layer of the plurality of antiferromagnetic layers having a magnetization direction in the first direction;

a ferromagnetic layer in direct contact with the top layer of the plurality of antiferromagnetic layers;

a first multilayer structure in direct contact with the ferromagnetic layer;

a metal layer in direct contact with the first multilayer structure; and a second multilayer structure in direct contact with the metal layer, wherein the second multilayer structure is part of a reference layer, wherein the ferromagnetic layer, the first multilayer structure and the second multilayer structure are each parallel to an x-y plane, wherein the first direction is either in a z-direction or in a −z direction, wherein a magnetization direction of the second multilayer structure is in the second direction and is determined by and is opposite of the magnetization direction of the top layer of the plurality of antiferromagnetic layer, wherein the magnetization direction of the second multilayer structure is a reference direction of the TMR element, and wherein the first TMR element and the fourth TMR element each have a reference direction in the z-direction, and wherein the second TMR element and the third TMR element each have a reference direction in the −z-direction.

*   *   *   *   *